(12) United States Patent
Lee

(10) Patent No.: US 7,663,944 B2
(45) Date of Patent: Feb. 16, 2010

(54) SEMICONDUCTOR MEMORY DEVICE AND MEMORY SYSTEM USING SAME

(75) Inventor: Jung-Joon Lee, Bucheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 351 days.

(21) Appl. No.: 11/352,009

(22) Filed: Feb. 11, 2006

(65) Prior Publication Data
US 2006/0184755 A1    Aug. 17, 2006

(30) Foreign Application Priority Data
Feb. 14, 2005    (KR) ........................ 10-2005-0012054

(51) Int. Cl.
*G11C 29/00*    (2006.01)
(52) U.S. Cl. ...................... 365/194; 365/201
(58) Field of Classification Search ................ 365/194, 365/201, 189.17, 189.011; 711/167
See application file for complete search history.

(56) References Cited

U.S. PATENT DOCUMENTS

| | | | | |
|---|---|---|---|---|
| 5,969,999 A | * | 10/1999 | Lee | ............... 365/194 |
| 6,292,903 B1 | * | 9/2001 | Coteus et al. | ............... 713/401 |
| 6,339,555 B1 | * | 1/2002 | Hamada et al. | ............. 365/201 |
| 6,353,565 B2 | * | 3/2002 | Ito | ............................. 365/201 |
| 6,487,647 B1 | | 11/2002 | Samson | |
| 6,944,737 B2 | * | 9/2005 | Ahn et al. | ................. 711/167 |
| 2003/0067332 A1 | * | 4/2003 | Mikhalev et al. | ............ 327/158 |

FOREIGN PATENT DOCUMENTS

| | | |
|---|---|---|
| JP | 10-1999-0013465 | 2/1999 |
| KR | 10-2003-0034467 | 5/2003 |

* cited by examiner

*Primary Examiner*—J. H. Hur
*Assistant Examiner*—Douglas King
(74) *Attorney, Agent, or Firm*—F. Chau & Associates, LLC

(57) ABSTRACT

A semiconductor memory device includes an input data delay time adjustor for varying an input delay time, selecting one bit of a n-bit input data, delaying the selected one bit by the input delay time and outputting the delayed bit, in response to a control signal during an input data delay test operation; and an output data delay time adjustor for varying an output delay time, selecting one bit of a m-bit output data, delaying the selected one bit by the output delay time and outputting the delayed bit, in response to the control signal during an output data delay test operation, wherein the input data delay time adjustor is arranged for n-bit input data, and wherein the output data delay time adjustor is arranged for m-bit output data.

13 Claims, 6 Drawing Sheets

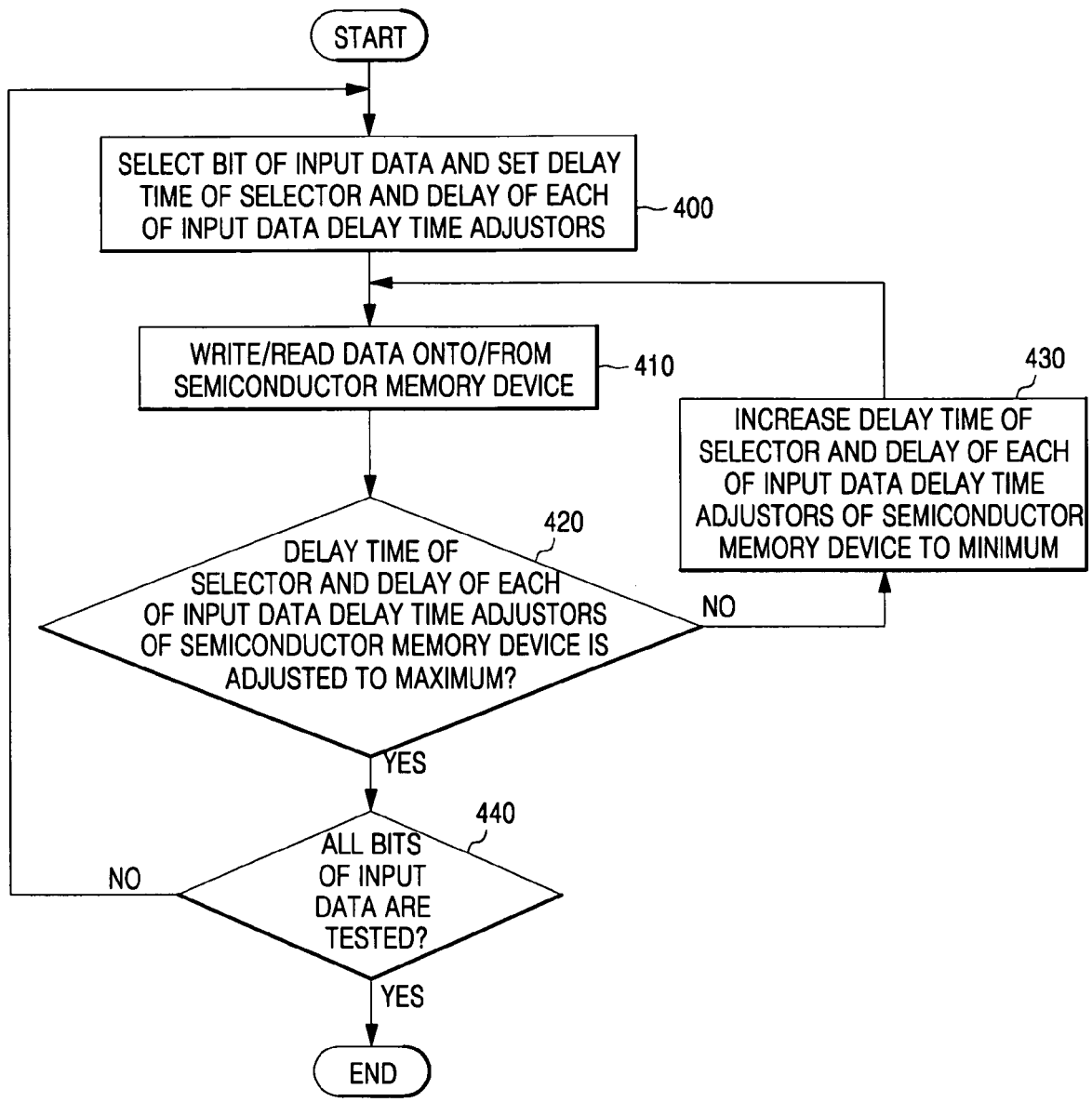

SEMICONDUCTOR MEMORY DEVICE AND MEMORY SYSTEM USING SAME

CROSS-REFERENCE TO RELATED APPLICATION

This application claims priority to Korean Patent Application No. 2005-12054, filed on Feb. 14, 2005, the disclosure of which is herein incorporated by reference in its entirety.

BACKGROUND OF THE INVENTION

1. Technical Field

The present invention relates to a semiconductor memory device and, more particularly, to a semiconductor memory device and a memory system using the same which can reduce a delay time difference between output data bits during a read operation and between input data bits during a write operation.

2. Description of the Related Art

A typical memory system includes a semiconductor memory device and a memory controller. In general, a delay time difference occurs between data bits outputted from a semiconductor memory device during a read operation and between data bits inputted to the semiconductor memory device during a write operation.

The typical memory system may adjust a delay time of an input data strobe signal inputted from the semiconductor memory device together with the input data to find the optimum spacing (timing) between the input data bits, and may adjust a delay time of an output data strobe signal outputted from the semiconductor memory device together with the output data to find optimum spacing (timing) between the output data bits.

However, as the operational speed of memory systems has increased, adjusting the delay time of the input data strobe signal and the output data strobe signal has become less effective. Furthermore, since the input data bits and the output data bits which have a delay time difference are generally 1 or 2 bits, it is not efficient to arrange the delay for each input data bit and each output data bit.

SUMMARY OF THE INVENTION

In accordance with an aspect of the present invention, a semiconductor memory device includes: an input data delay time adjustor for varying an input delay time, selecting one bit of n-bit input data, delaying the selected one bit by the input delay time and outputting the delayed bit, in response to a control signal during an input data delay test operation, where n is a predetermined integer; and an output data delay time adjustor for varying an output delay time, selecting one bit of m-bit output data, delaying the selected one bit by the output delay time and outputting the delayed bit, in response to the control signal during an output data delay test operation, where n is a predetermined integer, wherein the input data delay time adjustor is arranged for n-bit input data, and the output data delay time adjustor is arranged for m-bit output data.

In an exemplary embodiment of the present invention, the semiconductor memory device generates a mode setting command in response to a command for mode setting, and receives a code to generate the control signal in response to the mode setting command.

In an exemplary embodiment of the present invention, the input data delay time adjustor includes a first switch for transmitting the n-bit input data to a normal input line or a test input line in response to the control signal; a selector and delay for selecting one bit of the n-bit input data outputted from the first switch transmitted to the test input line, delaying the selected bit by the input delay time and outputting the delay bit, in response to the control signal; and a second switch for transmitting data outputted from the first switch or transmitting data outputted from the selector and delay in response to the control signal. The selector and delay includes a first selector for selecting one bit of the n-bit input data outputted from the first switch in response to the control signal; a delay for varying the input delay time and delaying a bit outputted from the first selector by the input delay time in response to the control signal; and a second selector for selecting an output data of the delay and outputting as one bit of the n-bit input data in response to the control signal.

In an exemplary embodiment of the present invention, the output data delay time adjustor includes a first switch for transmitting the n-bit input data to a normal output line or a test output line in response to the control signal; a selector and delay for selecting one bit outputted from the first switch transmitted to the test output line, delaying the selected bit by the output delay time and outputting the delay bit, in response to the control signal; and a second switch for transmitting data outputted from the first switch or transmitting data outputted from the selector and delay in response to the control signal. The selector and delay includes a first selector for selecting one bit of the m-bit output data outputted from the first switch in response to the control signal; a delay for varying the output delay time and delaying a bit outputted from the first selector by the output delay time in response to the control signal; and a second selector for selecting an output data of the delay and outputting as one bit of the m-bit output data in response to the control signal.

In accordance with an aspect of the present invention, a semiconductor memory includes: an output data delay time adjustor for varying an output delay time, selecting one bit of m-bit output data, delaying the selected one bit by the output delay time and outputting the delayed bit, in response to the control signal during an output data delay test operation, wherein the output data delay time adjustor is arranged for m-bit output data.

In an exemplary embodiment of the present invention, memory system includes: a graphic memory including an input data delay time adjustor for varying an input delay time, selecting one bit of n-bit input data, delaying the selected one bit by the input delay time and outputting the delayed bit, in response to a control signal during an input data delay test operation; and an output data delay time adjustor for varying an output delay time, selecting one bit of m-bit output data, delaying the selected one bit by the output delay time and outputting the delayed bit, in response to the control signal during an output data delay test operation, wherein the input data delay time adjustor is arranged for n-bit input data, and wherein the output data delay time adjustor is arranged for m-bit output data; and a semiconductor memory device for storing data outputted from the output data delay time adjustor during the input data delay test operation and outputting the stored data to the input data delay time adjustor during the output data delay test operation.

BRIEF DESCRIPTION OF THE DRAWINGS

The present invention will become more apparent to those of ordinary skill in the art when descriptions of exemplary embodiments thereof are read with reference to the accompanying drawings, of which:

FIG. 6 is a flowchart illustrating a method for testing bits of input data of the semiconductor memory device according to an exemplary embodiment of the present invention.

DETAILED DESCRIPTION OF THE EXEMPLARY EMBODIMENTS

Figure 1:
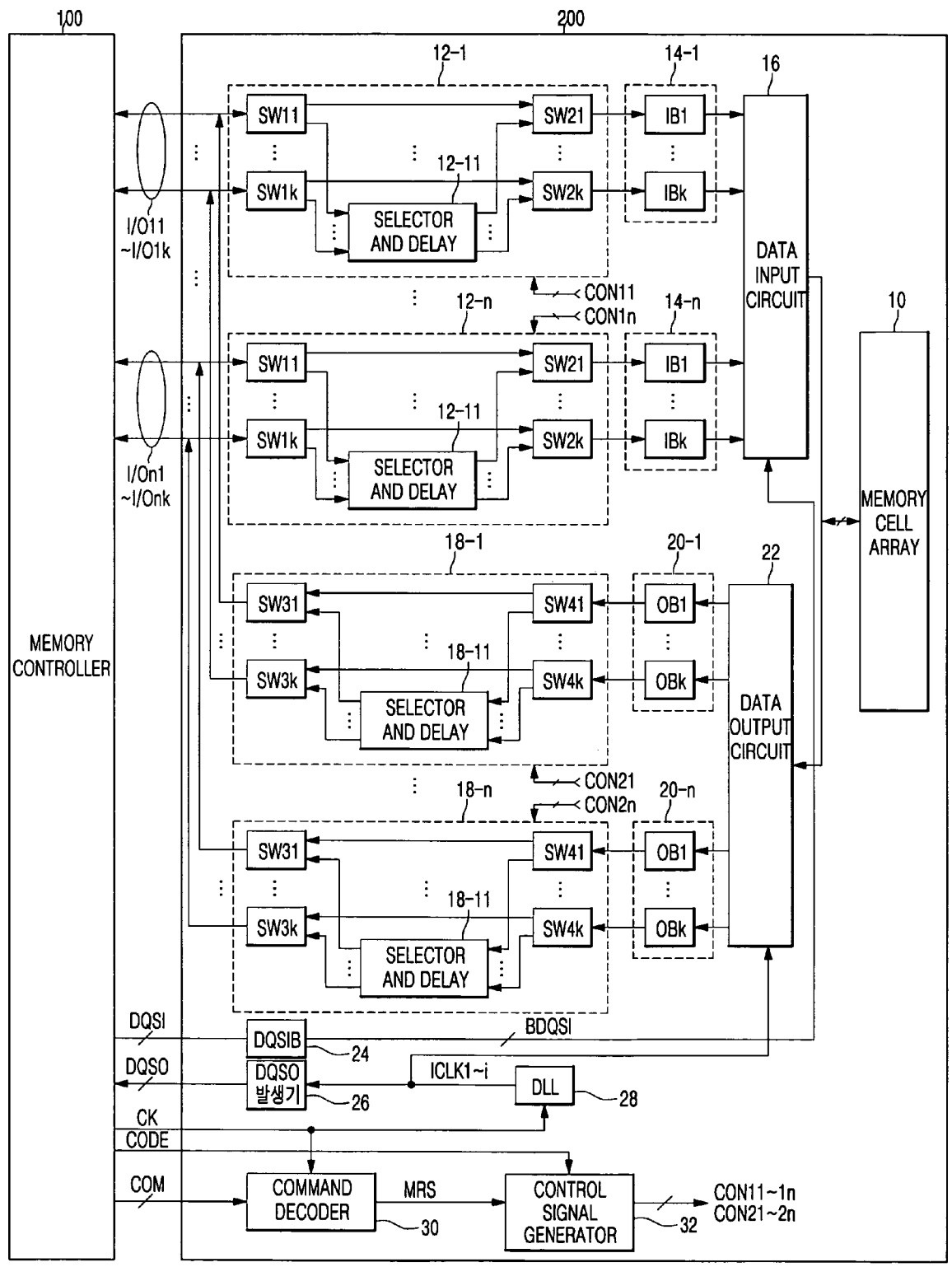
FIG. 1 is a block diagram illustrating a memory system according to an exemplary embodiment of the present invention.

Hereinafter, the exemplary embodiments of the present invention will be described in detail with reference to the accompanying drawings. In the drawings, the size and relative sizes of layers and regions may be exaggerated for clarity. Like reference numerals refer to similar or identical elements throughout the description of the figures.

FIG. 1 is a block diagram illustrating a memory system according to an exemplary embodiment of the present invention. Referring to FIG. 1, the memory system includes a memory controller 100 and a semiconductor memory device 200. The semiconductor memory device 200 includes a memory cell array 10, n input data delay time adjustors 12-1 to 12-n, n data input buffers 14-1 to 14-n, a data input circuit 16, n output data delay time adjustors 18-1 to 18-n, n data output buffers 20-1 to 20-n, a data output circuit 22, an input data strobe signal buffer 24, an output data strobe signal generator 26, a delay locked loop 28, a command decoder 30, and a control signal generator 32.

Each of the input data delay time adjustors 12-1 to 12-n includes k switches SW11 to SW1k and SW21 to SW2k and a selector and delay 12-11. Each of the output data delay time adjustors 18-1 to 18-n includes k switches SW31 to SW3k and SW41 to SW4k and a selector and delay 18-11. Each of the data input buffers 14-1 to 14-n includes k input buffers IB1 to IBk, and each of the data output buffers 20-1 to 20-n includes k output buffers OB1 to OBk.

Hereinafter, the components of a memory system in accordance with an exemplary embodiment of the present invention will be described with reference to FIG. 1.

The input data delay time adjustors 12-1 to 12-n respectively select one bit of input data I11 to I1k~In1 to Ink in response to control signals CON11 to CON1n during an input data delay test operation to adjust a delay time. When the input data delay test operation is completed, the input data delay time adjustors 12-1 to 12-n respectively set a delay time for the input data I11 to I1k~In1 to Ink in response to the control signals CON11 to CON1n. During normal operation, the input data delay time adjustors 12-1 to 12-n respectively delay the input data I11 to I1k~In1 to Ink by the set delay time.

Each of the data input buffers 14-1 to 14-n include input buffers IB1 to IBk. The data input buffers 14-1 to 14-n respectively buffer k-bit data outputted from the input data delay time adjustors 12-1 to 12-n through the input buffers IB1 to IBk, and output the buffered data. The data input circuit 16 receives the buffered data from the k input buffers IB1 to IBk. The data input circuit 16 parallel-converts the buffered data and sequentially outputs the parallel-converted data in response to an input data strobe signal BDQSI.

The memory cell array 10 stores data outputted from the data input circuit 16 during a write operation and outputs the stored data during a read operation. The output data circuit 22 serial-converts data outputted from the memory cell array 10 and sequentially outputs the serial-converted data in response to i internal clock signals ICLK1 to ICLKi having the same phase difference.

Each of the data output buffers 20-1 to 20-n include the output buffers OB1 to OBk. The data output buffers 20-1 to 20-n respectively buffer k data outputted from the data output circuit 22 through the output buffers OB1 to OBk and output the data. The output data delay time adjustors 18-1 to 18-n respectively select one bit buffered by one of the output buffers OB1 to OBk in response to the control signals CON21 to CON2n during an output data delay test operation to adjust a delay time. When the output data delay test operation is completed, the output data delay time adjustors 18-1 to 18-n respectively set a delay time for data buffered by the output buffers OB1 to OBk in response to the control signals CON21 to CON2n. The input data strobe signal buffer 24 buffers an input data strobe signal DQSI to generate the buffered input data strobe signal BDQSI. The output data strobe signal buffer 26 receives the internal clock signals ICLK1 to ICLKi to generate an output data strobe signal DQSO. The delay locked loop 28 generates the internal clock signals ICLK1 to ICLKi having the same phase difference in response to a clock signal CK. The command decoder 30 decodes a command COM in response to the clock signal CK to generate a mode setting command MRS. The control signal generator 32 receives a code CODE in response to the mode setting command MRS to generate the control signals CON11 to CON1n and CON21 to CON2n. The code CODE may be applied through an address input pin (not shown). The memory controller 100 uses the command COM and the code CODE to generate the control signals CON11 to CON1n and CON21 to CON2n for adjusting the delay time of the switches SW1 to SW4 and the selector and delays 21-11 and 18-11 of the input and output data delay time adjustors 12-1 to 12-n and 18-1 to 18-n, respectively, during the respective input and output data delay test operations. It is possible to adjust the delay time of the selector and delays 12-11 and 18-11 from a minimum value to a maximum value by changing the code CODE. The input data delay test operation can be sequentially performed for the first input data group I11 to In1 to the k-th input data group I1k to Ink. The output data delay test operation can be sequentially performed for the first output data group O11 to On1 to the k-th output data group O1k to Onk.

Figure 2:
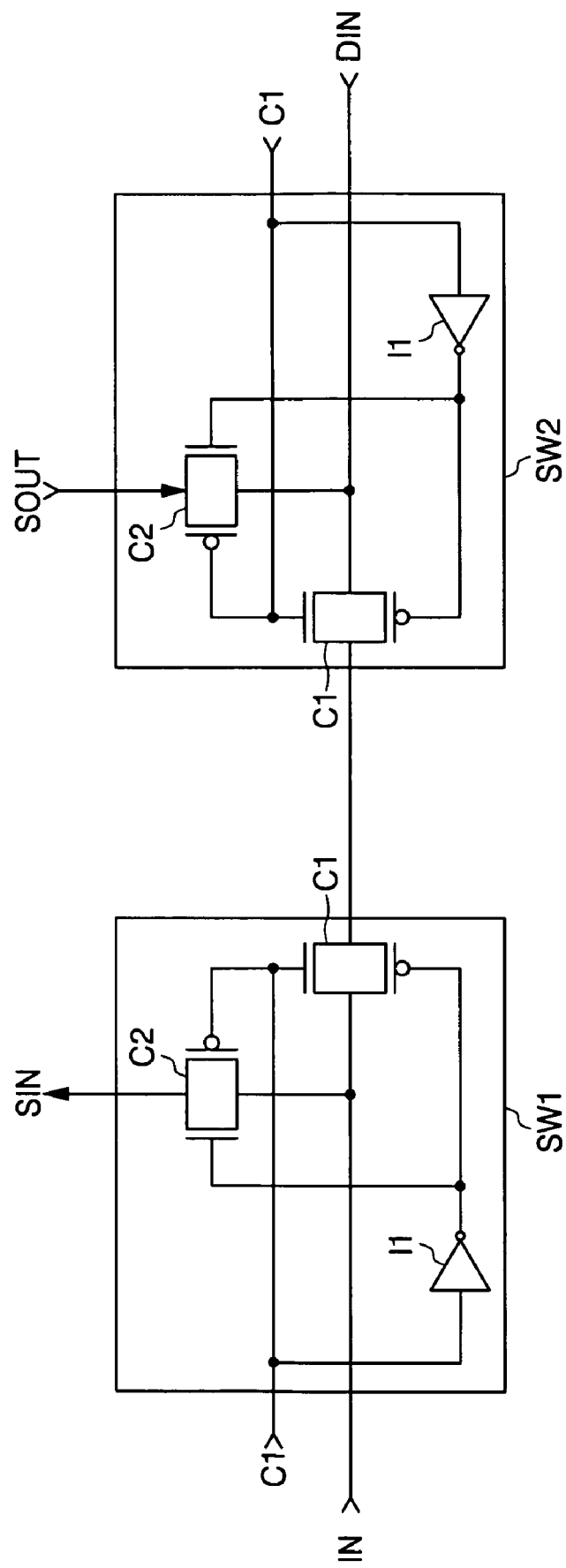
FIG. 2 is a circuit diagram illustrating switches of the memory system of FIG. 1.

FIG. 2 is a circuit diagram illustrating the switches SW1 and SW2 of the memory system of FIG. 1. Referring to FIG. 2, each of the switches SW1 and SW2 includes an inverter I1 and COMS transmission gates C1 and C2.

In FIG. 2, IN denotes input data inputted to the switch SW1, SIN denotes data inputted to the selector and delay 12-11, SOUT denotes data outputted from the selector and delay 12-11, DIN denotes data outputted from the switch SW2, and C1 denotes a signal contained in each of the control signals CON11 to CON1n.

Hereinafter, the components of a memory system in accordance with an exemplary embodiment of the present invention will be described with reference to FIG. 2.

If a control signal C1 having a high level is applied, the COMS transmission gate C2 of each of the switches SW1 and SW2 is turned off and the COM transmission gate C1 is turned on, so that the input data IN is transmitted as the data DIN. On the other hand, if a control signal C1 having a low level is applied, the COMS transmission gate C1 of each of the switches SW1 and SW2 is turned off and the COM transmission gate C2 is turned on, so that the input data IN is transmitted as the data SIN and the data SOUT is transmitted as the data DIN. If the control signal C1 having a high level is applied, the data IN is outputted as the data DIN, and if the control signal C1 having a low level is applied, the data IN is delayed by a prescribed time period through the selector and delay 12-11 and then is outputted as the data DIN.

Although not shown as such, the switches SW3 and SW4 have the same configuration as the switches SW1 and SW2 of FIG. 2 except for an opposite signal transmission direction.

Figure 3:
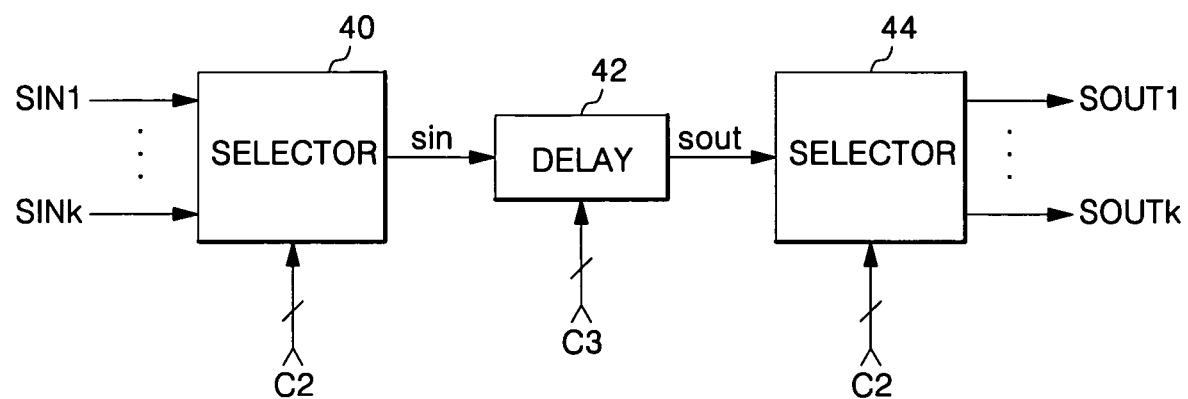
FIG. 3 is a block diagram illustrating a selector and delay of the memory system of FIG. 1.

FIG. 3 is a block diagram illustrating the selector and delay 12-11 of the memory system of FIG. 1. The selector and delay configuration of FIG. 3 includes selectors 40 and 44 and a delay 42.

In FIG. 3, C2 represents a signal contained in each of the control signals CON11 to CON1$n$ and consists of a predetermined number of bits, and C3 is a signal contained in each of the control signals CON11 to CON1$n$ and consists of a predetermined number of bits.

Hereinafter, components of a memory system in accordance with an exemplary embodiment of the present invention will be described with reference to a with reference to FIG. 3.

The selector 40 selects one bit of k-bit data SIN1 to SINk to generate data sin in response to the control signal C2. The delay 42 delays the data sin outputted from the selector 40 by a delay time which is adjusted from a minimum delay time to a maximum delay time and generates output data sout, in response to the control signal C3. The selector 44 selects the output data sout and outputs it as one bit of the k-bit data SOUT1 to SOUk, in response to the control signal C2.

Although not shown as such, the selector and delay 18-11 has the same configuration as the selector and delay 12-11 except for an opposite signal transmission direction.

Figure 4:
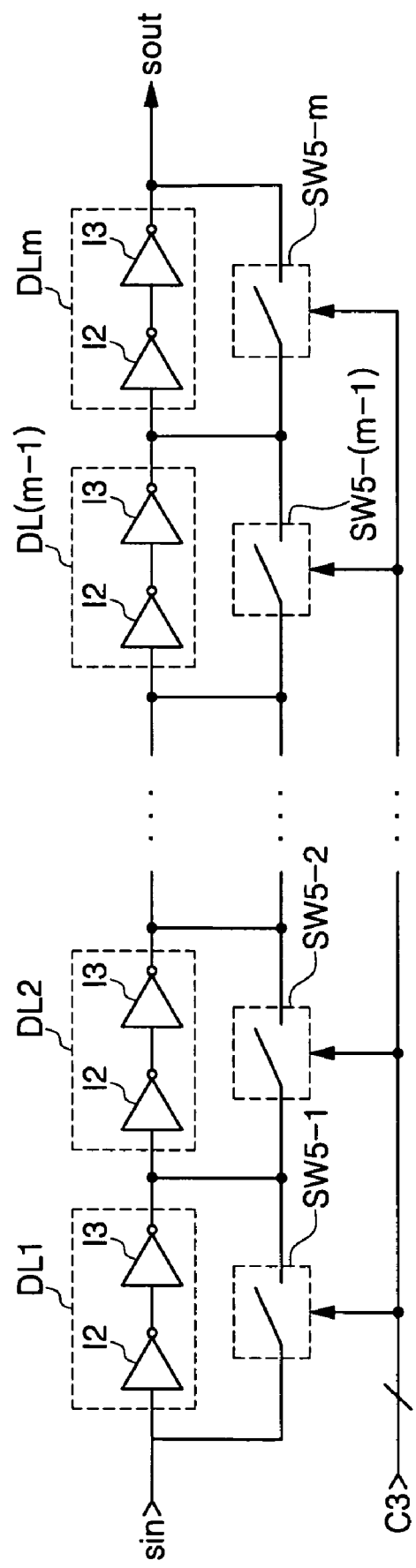
FIG. 4 is a circuit diagram illustrating a delay of the selector and delay of FIG. 3.

FIG. 4 is a circuit diagram illustrating the delay of the selector and delay configuration of FIG. 3. Referring to FIG. 4, the delay includes delays DL1 to DLm and switches SW5-1 to SW5-$m$. Each of the delays DL1 to DLm includes two inverters I2 and I3 which are serially connected to each other. In FIG. 4, C3 represents an m-bit signal contained in each of the control signals CON11 to CON1$n$.

Hereinafter, the operation of the delay will be described with reference to FIG. 4.

If all bits of the m-bit signal C3 have a high level, all of the switches SW5-1 to SW5-$m$ are turned on, so that the signal sin is not delayed by the delays DL1 to DLm and is generated as the output data sout, and a delay time generated by the delays DL1 to DLm is minimized. On the other hand, if all bits of the m-bit signal C3 have a low level, all of the switches SW5-1 to SW5-$m$ are turned off, and the signal sin is delayed by the delays DL1 to DLm and is generated as the output data sout, and a delay time generated by the delays DL1 to DLm is maximized.

The delay of FIG. 4 gradually increases a delay time generated by the delays DL1 to DLm as the number of bit of the m-bit signal C3 data which has a low level is increased.

Figure 5:
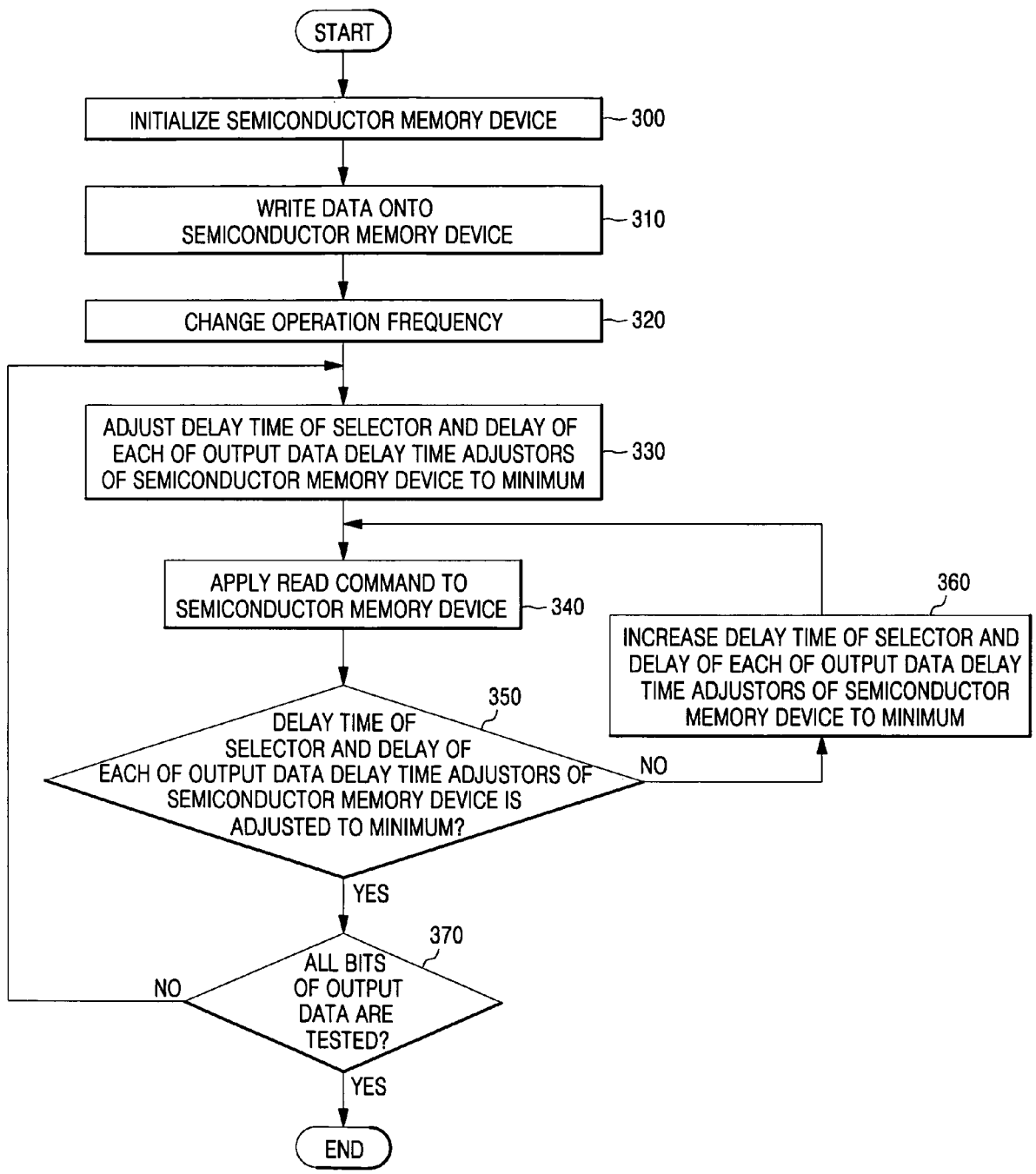
FIG. 5 is a flowchart illustrating a method of testing bits of output data of a semiconductor memory device according to an exemplary embodiment of the present invention.

FIG. 5 is a flowchart illustrating a method of testing bits of output data of the semiconductor memory device according to an exemplary embodiment of the present invention.

Referring to FIG. 5, in a step 300, the semiconductor memory device 200 is initialized by a power-on or reset operation.

The memory controller 100 applies a clock signal CK of a low frequency a command COM for write operation to the semiconductor memory device 200 and applies write data, in a step 310. The low-frequency clock signal CK is used to stably write data onto the semiconductor memory device 200.

In a step 320, the memory controller 100 converts the low-frequency clock signal into the high-frequency clock signal CK.

In a step 330, the memory controller 100 applies a command COM and a code CODE for mode setting operation to adjust to a minimum a delay time of the selector and delay 18-11 of each of the output data delay time adjustors 18-1 to 18-$n$ of the semiconductor. The semiconductor memory device 200 internally generates a mode setting command MRS and receives a code CODE used to generate control signals CON21 to CON2$n$. The semiconductor memory device 200 adjusts a delay time of the selector and delay 18-11 to a minimum in response to the control signals CON21 to CON2$n$, and the switches SW31 to SW3$k$ and SW41 to SW4$k$ of each of the output data delay time adjustors 18-1 to 18-$n$ are connected to the selector and delay 18-11.

The memory controller 100 applies a read command to the semiconductor memory device 200 and inputs selected bits of each group among the output data of n groups one by one, in a step 340.

In a step 350, the memory controller 100 determines whether or not a delay time of the selector and delay 18-11 of each of the output data delay time adjustors 18-1 to 18-$n$ of the semiconductor memory device is adjusted to a maximum.

If the step 350 is not satisfied, then in a step 360 the memory controller 100 generates a command COM and a code CODE for mode setting operation to increase a delay time of the selector and delay 18-11 of each of the output data delay time adjustors 18-1 to 18-$n$ of n groups of the semiconductor memory device, and the procedure goes back to the step 340.

If the step 350 is satisfied, then in a step 370 it is determined whether or not all bits of the output data of n groups are tested.

If the step 370 is not satisfied, then the memory controller 100 goes back to the step 330. If the step 370 is satisfied, the output data delay test operation ends. When the output data delay test operation is completed according to the above-described method, the memory controller 100 finds a bit of the output data having a delay time difference, controls the switches SW31 and SW41 of the output data delay time adjustor of the corresponding bit, and applies a command COM and a code CODE for a mode setting command to set a delay time of the selector and delay 18-11.

FIG. 6 is a flowchart illustrating a method of testing bits of input data of the semiconductor memory device according to an exemplary embodiment of the present invention.

Referring to FIG. 6, in a step 400, a command COM and a code CODE for mode setting operation are applied to select bits of input/output data I/O11 to I/O1$k$~I/On1 to I/Onk of respective groups and set a delay time of the selector and delay 12-11 of each of the input data delay time adjustors 12-1 to 12-$n$ to a minimum. The semiconductor memory device 200 internally generates the mode setting command MRS and inputs the code CODE to generate the control signals CON11 to CON1$n$. In response to the control signals CON11 to CON1$n$, a delay time of the selector and delay 12-11 is adjusted to a minimum, and the switches SW11 to SW1$k$ and SW21 to SW2$k$ of each of the input data delay time adjustors 12-1 to 12-$n$ are connected to the selector and delay 12-11.

The memory controller 100 writes/reads data onto/from the semiconductor memory device 200, in a step 410.

In a step 420, the memory controller 100 determines whether or not a delay time of the selector and delay 12-11 of each of the input data delay time adjustors 12-1 to 12-$n$ of n groups is set to a maximum.

If the step 420 is not satisfied, then in a step 430 the memory controller 100 increases the delay time of the selector and delay 12-11 of each of the input data delay time adjustors 12-1 to 12-n of the semiconductor memory device 200, and the procedure goes back to the step 410.

If the step 420 is satisfied, then in a step 440 the memory controller 100 determines whether or not all bits of the input data of n groups are tested.

If the step 440 is not satisfied, the memory controller 100 goes back to the step 400. If the step 440 is satisfied, the input data delay test operation ends.

When the output data delay test operation is completed according to the above-described method, the memory controller 100 finds a bit of the input data having a delay time difference, controls the switches SW11 and SW21 of the output data delay time adjustor of the corresponding bit, and applies a command COM and a code CODE for the mode setting command to set a delay time of the selector and delay 12-11.

To compensate for a delay time difference between bits of the input data and between bits of the output data, the semiconductor memory device and the memory system using the same according to an exemplary embodiment of the present invention is configured such that input/output is divided into n groups and each group has one delay. In accordance with exemplary embodiments of the present invention, a delay time difference between bits of the input data and between bits of the output data can be efficiently reduced while minimizing increment of a layout area size of the semiconductor memory device. For example, each group may be configured to receive and output data comprising 4 or more bits.

In the exemplary embodiment of the present invention described above, the input data delay time adjustor and output data delay time adjustor are included in the semiconductor memory device; however, it is to be understood that the input data delay time adjustor and output data delay time adjustor can be included in the memory controller. Alternatively, the input data delay time adjustor and output data delay time adjustor can be arranged such that either the input data delay time adjustor or output data delay time adjustor is included in the semiconductor memory device and the other is included in the memory controller.

The layout area size of the semiconductor memory device, according to exemplary embodiments of the present invention, can be minimized because the semiconductor memory device has one delay per unit of a predetermined number of input/output data to perform the test operation for compensating a delay time difference between bits of the input data and between bits of the output data.

The memory system having the semiconductor memory device according to the exemplary embodiments of the present invention can efficiently compensate a delay time difference between bits of input/output data while inputting and outputting data at a high speed.

Although the exemplary embodiments of the present invention have been described with reference to the accompanying drawings for the purpose of illustration, it is to be understood that the inventive processes and apparatus are not to be construed as limited thereby. It will be readily apparent to by those of ordinary skill in the art that various modifications to the foregoing exemplary embodiments may be made without departing from the scope of the invention as defined by the appended claims, with equivalents of the claims to be included therein.

What is claimed is:

1. A semiconductor memory device, comprising:
   an input data delay time adjustor for varying an input delay time, selecting one bit of n-bit input data, delaying a selected one bit of the n-bit input data by the input delay time and outputting the delayed bit, in response to a control signal during an input data delay test operation, where n is a predetermined integer; and
   an output data delay time adjustor for varying an output delay time, selecting one bit of m-bit output data, delaying a selected one bit of the m-bit output data by the output delay time and outputting the delayed bit, in response to the control signal during an output data delay test operation, where m is a predetermined integer,
   wherein the input data delay time adjustor is arranged for the n-bit input data, and wherein the output data delay time adjustor is arranged for the m-bit output data;
   wherein the semiconductor memory device generates a mode setting command in response to a command for a mode setting which is applied from an external portion, and receives a code applied from the external portion to generate the control signal in response to the mode setting command; and
   wherein the input data delay time adjustor includes:
      a first input switch for transmitting the n-bit input data to a normal input line or a test input line in response to the control signal;
      an input selector and delay for selecting the one bit of the n-bit input data outputted from the first input switch transmitted to the test input line, delaying the selected one bit of the n-bit input data by the input delay time and outputting the delay bit, in response to the control signal; and
      a second input switch for transmitting data outputted from the first input switch or transmitting data outputted from the input selector and delay in response to the control signal.

2. The semiconductor memory device of claim 1, wherein the input selector and delay includes:
   a first input selector for selecting the one bit of the n-bit input data outputted from the first input switch in response to the control signal;
   an input delay for varying the input delay time and delaying the selected one bit of the n-bit input data outputted from the first input selector by the input delay time in response to the control signal; and
   a second input selector for selecting an output data of the input delay and outputting as one bit of the n-bit input data in response to the control signal.

3. The semiconductor memory device of claim 1, wherein the output data delay time adjustor includes:
   a first output switch for transmitting the m-bit output data to a normal output line or a test output line in response to the control signal;
   an output selector and delay for selecting the one bit of the m-bit output data outputted from the first output switch transmitted to the test output line, delaying the selected one bit of the m-bit output data by the output delay time and outputting the delay bit, in response to the control signal; and
   a second output switch for transmitting data outputted from the first output switch or transmitting data outputted from the output selector and delay in response to the control signal.

4. The semiconductor memory device of claim 3, wherein the output selector and delay includes:
   a first output selector for selecting the one bit of the m-bit output data outputted from the first output switch in response to the control signal;

an output delay for varying the output delay time and delaying the selected one bit of the m-bit output data outputted from the first output selector by the output delay time in response to the control signal; and a second output selector for selecting an output data of the output delay and outputting as one bit of the m-bit output data in response to the control signal.

5. The semiconductor memory device of claim 1, wherein delaying the selected one bit includes delaying a variable amount of delay of the selected one bit, wherein delaying the selected one bit of the n-bit input data includes delaying a variable amount of delay of the selected one bit of the n-bit input data; and wherein delaying the selected one bit of the m-bit output data includes delaying a variable amount of delay of the selected one bit of the m-bit output data.

6. A semiconductor memory device, comprising:

an output data delay time adjustor for varying an output delay time, selecting one bit of a m-bit output data, delaying a selected one bit of the m-bit output data by the output delay time and outputting the delayed bit, in response to a control signal during an output data delay test operation, where m is a predetermined integer, wherein the output data delay time adjustor is arranged for the m-bit output data;

wherein the semiconductor memory device generates a mode setting command in response to a command for a mode setting which is applied from an external portion, and receives a code applied from the external portion to generate the control signal in response to the mode setting command; and wherein the output data delay time adjustor includes:

a first output switch for transmitting the m-bit output data to a normal output line or a test output line in response to the control signal;

an output selector and delay for selecting the one bit of the m-bit output data outputted from the first output switch transmitted to the test output line, delaying the selected one bit of the m-bit output data by the output delay time and outputting the delay bit, in response to the control signal; and a second output switch for transmitting data outputted from the first output switch or transmitting data outputted from the output selector and delay in response to the control signal.

7. The semiconductor memory device of claim 6, wherein the output selector and delay includes:

a first output selector for selecting the one bit of the m-bit output data outputted from the first output switch in response to the control signal;

an output delay for varying the output delay time and delaying the selected one bit of the m-bit output data outputted from the first output selector by the output delay time in response to the control signal; and a second output selector for selecting an output data of the output delay and outputting as one bit of the m-bit output data in response to the control signal.

8. The semiconductor memory device of claim 6, wherein delaying the selected one bit includes delaying a variable amount of delay of the selected one bit, wherein delaying the selected one bit of the m-bit output data includes delaying a variable amount of delay of the selected one bit of the m-bit output data.

9. A memory system, comprising:

a graphic memory including an input data delay time adjustor for varying an input delay time, selecting one bit of n-bit input data, delaying a selected one bit of the n-bit input data by the input delay time and outputting the delayed bit, in response to a control signal during an input data delay test operation; and an output data delay time adjustor for varying an output delay time, selecting one bit of m-bit output data, delaying a selected one bit of the m-bit output data by the output delay time and outputting the delayed bit, in response to the control signal during an output data delay test operation, wherein the input data delay time adjustor is arranged for the n-bit input data, and the output data delay time adjustor is arranged for the m-bit output data; and wherein the semiconductor memory device generates a mode setting command in response to a command for a mode setting which is applied from an external portion, and receives a code applied from the external portion to generate the control signal in response to the mode setting command; and a semiconductor memory device for storing data outputted from the output data delay time adjustor during the input data delay test operation and outputting the stored data to the input data delay time adjustor during the output data delay test operation;

wherein the input data delay time adjustor includes:

a first input switch for transmitting the n-bit input data to a normal input line or a test input line in response to the control signal;

an input selector and delay for selecting the one bit of the n-bit input data outputted from the first input switch transmitted to the test input line, delaying the selected one bit of the n-bit input data by the input delay time and outputting the delay bit, in response to the control signal; and a second input switch for transmitting data outputted from the first input switch or transmitting data outputted from the input selector and delay in response to the control signal.

10. The memory system of claim 9, wherein the input selector and delay includes:

a first input selector for selecting the one bit of the n-bit input data outputted from the first input switch in response to the control signal;

an input delay for varying the input delay time and delaying the selected one bit of the n-bit input data outputted from the first input selector by the input delay time in response to the control signal; and a second input selector for selecting an output data of the input delay and outputting as one bit of the n-bit input data in response to the control signal.

11. The memory system of claim 9, wherein the output data delay time adjustor includes:

a first output switch for transmitting the m-bit output data to a normal output line or a test output line in response to the control signal;

an output selector and delay for selecting the one bit of the m-bit output data outputted from the first output switch transmitted to the test output line, delaying the selected one bit of the m-bit output data by the output delay time and outputting the delay bit, in response to the control signal; and a second output switch for transmitting data outputted from the first output switch or transmitting data outputted from the output selector and delay in response to the control signal.

12. The memory system of claim 11, wherein the output selector and delay includes:

a first output selector for selecting the one bit of the m-bit output data outputted from the first output switch in response to the control signal;

an output delay for varying the output delay time and delaying the selected one bit of the m-bit output data outputted from the first output selector by the output delay time in response to the control signal; and a second output selector for selecting an output data of the output delay and outputting as one bit of the m-bit output data in response to the control signal.

13. The memory system of claim 9, wherein the input delay time adjustor includes an input variable delay module for delaying the selected one bit of the n-bit input data by a variable amount of delay and the output delay time adjustor includes an output variable delay module for delaying the selected one bit of the m-bit output data by a variable amount of delay.

* * * * *